United States Patent [19]

Inoi et al.

[11] Patent Number: 5,758,397
[45] Date of Patent: Jun. 2, 1998

[54] PROCESS FOR MAKING PIEZOELECTRIC CERAMIC TRANSFORMER HAVING LARGE VOLTAGE STEP-UP RATIO

[75] Inventors: Takayuki Inoi; Yuko Sato, both of Tokyo, Japan

[73] Assignee: NEC Corporation, Tokyo, Japan

[21] Appl. No.: 654,865

[22] Filed: May 29, 1996

[30] Foreign Application Priority Data

May 31, 1995 [JP] Japan ................... 7-133976

[51] Int. Cl.$^6$ ................................. H01L 41/22
[52] U.S. Cl. ........................ 29/25.35; 264/22
[58] Field of Search ................ 310/258, 259, 310/266; 29/25.35; 264/22

[56] References Cited

U.S. PATENT DOCUMENTS 5,463,266 10/1995 Fukuoka et al. .................. 310/259
5,504,384 4/1996 Lee et al. ............................ 310/259

FOREIGN PATENT DOCUMENTS

| 61-48299 | 3/1986 | Japan. |
| 61-48300 | 3/1986 | Japan. |
| 6414981 | 1/1989 | Japan. |
| 6450487 | 2/1989 | Japan. |
| 7193293 | 7/1995 | Japan. |
| 847094 | 2/1996 | Japan. |

OTHER PUBLICATIONS

Y. Kodama et al.; "The Study of Piezoelectric Ceramic Transformer for High Voltage Generation"; pp. 144–149.

*Primary Examiner*—Carl E. Hall
*Attorney, Agent, or Firm*—Whitham, Curtis & Whitham

[57] ABSTRACT

A driving section applied with an input a.c. voltage and a generator section for generating an output potential are incorporated in a piezoelectric ceramic transformer, and the generator section is polarized through a two-step polarizing technique where an electric field is created in the generator section in high temperature atmosphere and, thereafter, the temperature is decreased without changing the electric field, thereby saturating the polarization without a crack.

7 Claims, 11 Drawing Sheets

PROCESS FOR MAKING PIEZOELECTRIC CERAMIC TRANSFORMER HAVING LARGE VOLTAGE STEP-UP RATIO

FIELD OF THE INVENTION

This invention relates to a piezoelectric ceramic transformer and, more particularly, to a structure of a piezoelectric ceramic transformer achieving a large voltage step-up ratio and a process of fabricating the piezoelectric ceramic transformer without cracks.

DESCRIPTION OF THE RELATED ART

The piezoelectric ceramic transformer is fabricated on a piezoelectric ceramic plate, and is broken down into a driving section and a generator section. The driving section and the generator section occupy the piezoelectric ceramic plate, and are separated in a longitudinal direction of the piezoelectric ceramic plate. A pair of electrodes is provided in the driving section, and an a.c. voltage is applied to the pair of electrodes. The a.c. voltage causes the piezoelectric ceramic plate to generate longitudinal vibrations, and the longitudinal vibrations cause the generator section to generate a step-up voltage.

The piezoelectric ceramic transformer effectively steps up the input voltage, and is used as a high-voltage potential transformer in an electric power supply system such as a deflector of a television receiver or a charger of a copying machine. The piezoelectric ceramic transformer is smaller in volume than an electromagnetic transformer, and allows a manufacturer to scale down an electric power supply system.

Figure 1:
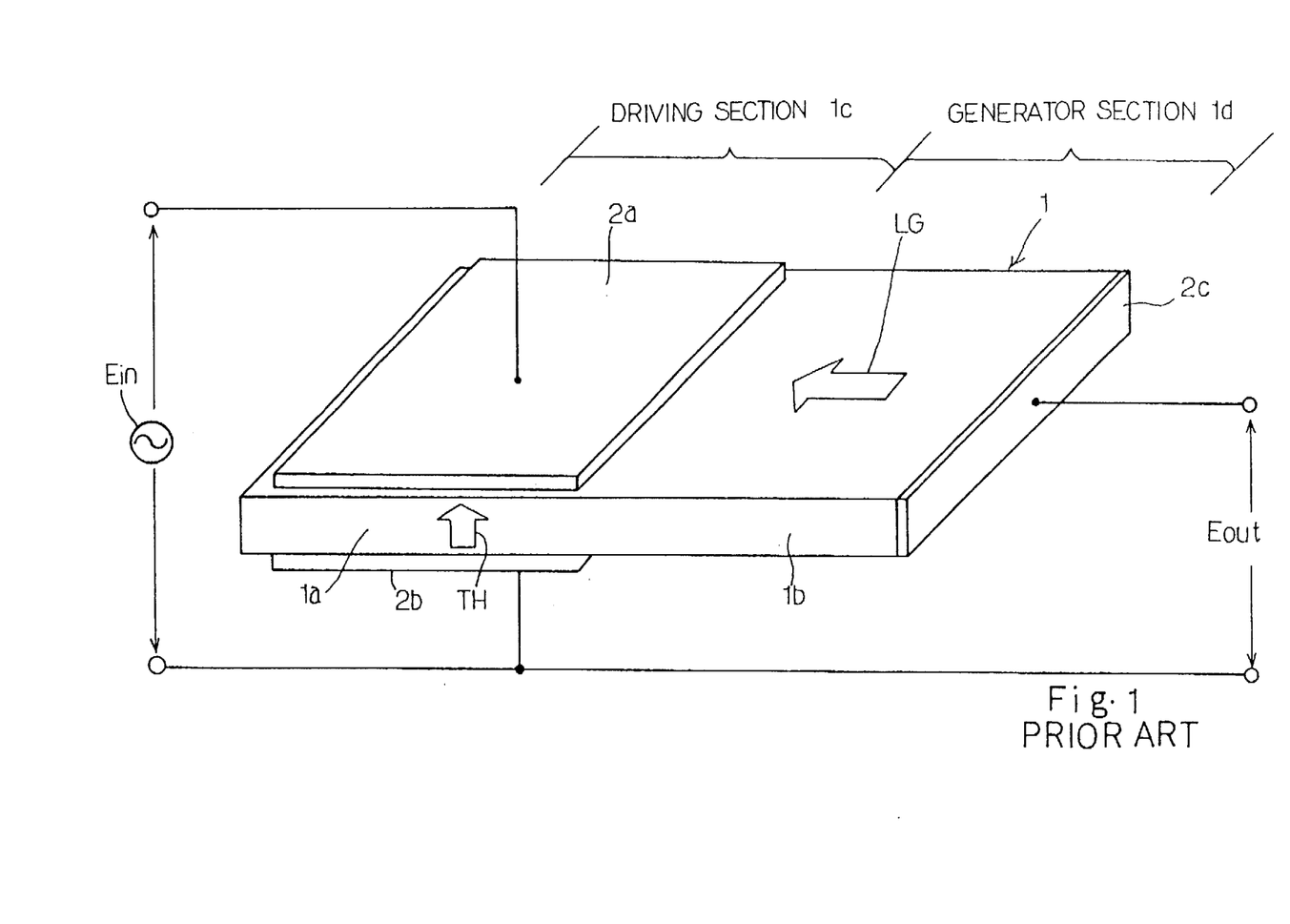
FIG. 1 is a perspective view showing the structure of the prior art piezoelectric ceramic transformer.

FIG. 1 illustrates a typical example of the Rosen-type piezoelectric ceramic transformer. The prior art piezoelectric ceramic transformer is fabricated on the basis of a piezoelectric ceramic plate 1, and the piezoelectric ceramic plate 1 is elongated in a direction indicated by an arrow LG. The piezoelectric ceramic plate 1 has a low-impedance portion 1a and a high-impedance portion 1b separated in the longitudinal direction LG, and a driving section 1c and a generator section 1d are respectively assigned to the low-impedance portion 1a and the high-impedance portion 1b.

The driving section 1c has a pair of electrodes 2a/2b, and the electrodes 2a/2b cover most of the upper surface and most of the lower surface of the low-impedance portion 1a. The electrodes 2a and 2b uncover the peripheries of the upper and lower surfaces of the low-impedance portion. The low-impedance portion 1a is polarized in a direction TH of the thickness of the piezoelectric ceramic plate 1.

On the other hand, the generator section 1d has an end surface electrode 2c attached to an end surface of the piezoelectric ceramic plate 1, and the high-impedance portion 1b is polarized in the longitudinal direction LG.

When an alternating-current source Ein is connected between the electrodes 2a and 2b, an a.c. voltage is applied to the low-impedance portion 1a, and a piezoelectric transverse effect takes place in the low-impedance portion 1a. The low-impedance portion 1a vibrates in the longitudinal direction LG. The longitudinal vibrations are propagated to the high-impedance portion 1b, and a piezoelectric longitudinal effect takes place in the high-impedance portion 1b. The piezoelectric longitudinal effect results in an output potential Eout between the electrodes 2b and 2c.

Figure 2:
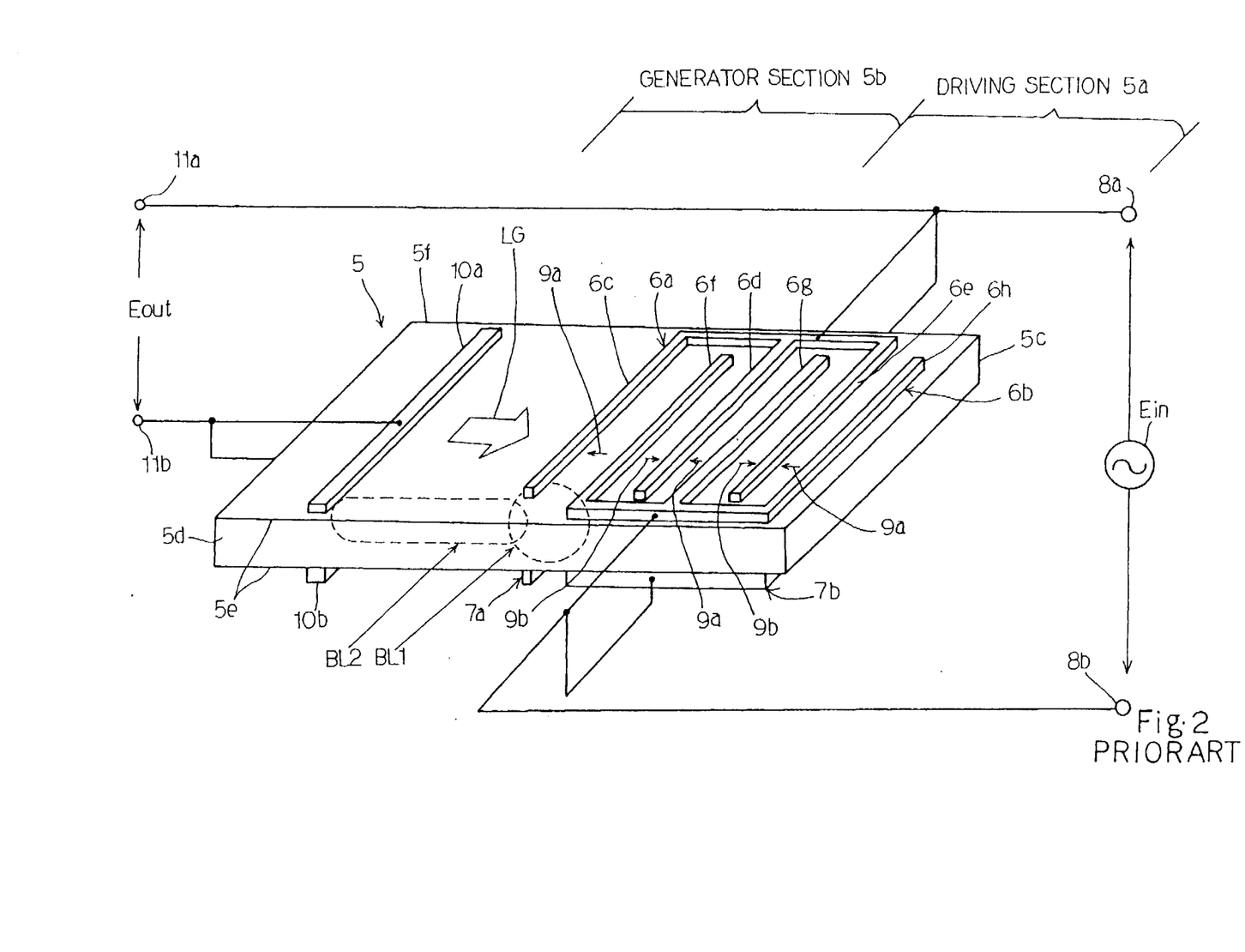
FIG. 2 is a perspective view showing the structure of the piezoelectric ceramic transformer disclosed in Japanese Patent Application No. 6-174417.

FIG. 2 illustrates a piezoelectric ceramic transformer disclosed in Japanese Patent Application No. 6-17447 filed by NEC Corporation. The piezoelectric ceramic transformer is also fabricated on a piezoelectric ceramic plate 5, and the piezoelectric ceramic plate 5 is shared between a driving section 5a and a generator section 5b.

The driving section 5a has two pairs of comb-like electrodes 6a/6b and 7a/7b, and the two pairs of comb-like electrodes 6a/6b and 7a/7b are respectively formed on the upper surface and the lower surface of the right portion 5c assigned to the driving section 5a. The comb-like electrodes 6a and 7a are respectively interdigitated with the comb-like electrodes 6b and 7b, and the comb-like electrodes 7a and 7b are located on the opposite side of the piezoelectric ceramic plate 5 from the comb-like electrodes 6a and 6b, respectively. The comb-like electrode 6a has finger portions 6c, 6d and 6e, and the other comb-like electrode 6b also has finger portions 6f, 6g and 6h. Gaps take place between the finger portions 6c and 6f, 6f and 6d, 6d and 6g, 6g and 6e and 6e and 6h. Though not clearly shown in FIG. 2, the comb-like electrodes 7a and 7b has finger portions, and gaps also take place therebetween.

The finger portions 6c to 6h define piezoelectric ceramic sub-portions exposed to the gaps defined therebetween, and the piezoelectric ceramic sub-portions are differently polarized. Namely, every other piezoelectric ceramic sub-portion is polarized in the opposite direction to the adjacent piezoelectric ceramic sub-portions. The piezoelectric ceramic sub-portions between the finger portions 6c and 6f, 6d and 6g and 6e and 6h are polarized in a direction indicated by arrows 9a, and the piezoelectric ceramic sub-portions between the finger portions 6f and 6d and 6g and 6e are polarized in a direction indicated by arrows 9b.

A pair of input terminals 8a/8b are provided for the two pairs of comb-like electrodes 6a/6b and 7a/7b. The input terminal 8a is connected to the comb-like electrodes 6a and 7a, and the other input terminal 8b is connected to the comb-like electrodes 6b and 7b.

The generator section 5b occupies a left portion 5d, and stripe-shaped electrodes 10a and 10b are formed on the upper and lower surfaces of the left portion 5d, respectively. The strip-shaped electrodes 10a and 10b are elongated in a direction of width of the piezoelectric ceramic plate 5. The stripe-shaped electrode 10b is formed on the opposite side of the piezoelectric ceramic plate 5 from the stripe-shaped electrode 10a, and the left portion 5d is polarized in the longitudinal direction LG of the piezoelectric ceramic plate 5.

A pair of output terminals 11a and 11b are provided for the generator section 5b. The stripe-shaped electrodes 10a and 10b are connected to the output terminal 11b, and the other output terminal 11a is connected to the comb-like electrodes 6a/7a.

When an a.c. voltage Ein is applied to the input terminals 8a and 8b, the piezoelectric longitudinal effect takes place in the driving section 5a, and the driving section 5a vibrates in the longitudinal direction LG. The longitudinal vibrations are propagated to the generator section 5b, and give rise to the longitudinal vibrations over the entire piezoelectric ceramic plate 5. The generator section 5b converts the longitudinal vibrations to an output potential Eout between the output terminals 1a and 11b through the piezoelectric longitudinal effect. Although the piezoelectric ceramic transformer shown in FIG. 2 has two sets of electrodes formed on the upper surface and the lower surface of the piezoelectric ceramic plate 5, respectively, one of the two sets of electrodes allows the piezoelectric ceramic transformer to step up the input potential Ein to the output potential Eout.

The piezoelectric ceramic transformer shown in FIG. 2 solves a problem inherent in the Rosen-type piezoelectric ceramic transformer shown in FIG. 1, and is superior to the Rosen-type piezoelectric ceramic transformer.

In detail, the output potential is taken out from the end surface electrode 2c of the Rosen-type piezoelectric ceramic transformer, and the end surface electrode 2c is connected to the output terminal. While the piezoelectric ceramic plate 1 is vibrating in the longitudinal direction LG, an antinode of the longitudinal vibrations takes place on the end surface electrode 32, and the output terminal is liable to be disconnected from the end surface electrode 2c.

On the other hand, the stripe-shaped electrodes 10a and 10b are held in contact with the upper surface and the lower surface of the piezoelectric ceramic plate 5, and the stripe-shaped electrodes 10a/10b are regulable to appropriate positions where a node of the longitudinal vibrations takes place. For this reason, the output terminal 1b is less liable to be disconnected from the stripe-shaped electrodes 10a/10b. This is the first advantage of the piezoelectric ceramic transformer shown in FIG. 2 over the Rosen-type piezoelectric ceramic transformer.

The second advantage over the Rosen-type piezoelectric ceramic transformer is a large voltage step-up ratio. Two factors relates to the voltage step-up ratio. One of the two factors is the piezoelectric effect for generating the longitudinal vibrations, and the other factor is the strength of the electric field.

In general, the piezoelectric longitudinal effect generates a strain larger than the piezoelectric transverse effect. As described hereinbefore, the driving section 1c of the Rosen-type piezoelectric vibrates in the longitudinal direction LG through the piezoelectric transverse effect, and the piezoelectric ceramic transformer shown in FIG. 2 generates the longitudinal vibrations in the driving section 5a through the piezoelectric longitudinal effect.

The stronger the electric field is, the larger the longitudinal vibrations that take place. When the gaps between the finger portions 6c to 6h are decreased, the electric field becomes stronger, and miniature patterning technologies for a semiconductor integrated circuit are available for extremely narrow gaps. Therefore, it is relatively easy to create a strong electric field in the driving section 5a of the piezoelectric ceramic transformer shown in FIG. 2. On the other hand, the thickness of the piezoelectric ceramic plate 1 relates to the strength of the electric field. It is necessary to decrease the thickness of the piezoelectric ceramic plate 1 for creating a stronger electric field in the driving section 1c. However, if the piezoelectric ceramic plate 1 is too thin, the piezoelectric ceramic plate 1 is much liable to be broken. For this reason, a stronger electric field is created in the piezoelectric ceramic transformer shown in FIG. 2 rather than the Rosen-type piezoelectric ceramic transformer.

Thus, the piezoelectric ceramic transformer shown in FIG. 2 is superior in both factors to the Rosen-type piezoelectric ceramic transformer, and, accordingly, achieves a large voltage step-up ratio.

As will be understood from the foregoing description, the piezoelectric ceramic transformer already proposed by NEC Corporation is desirable in view of the durability and the large voltage step-up ratio. However, problems are encountered in the piezoelectric ceramic transformer shown in FIG. 2 as follows.

The first problem is a trade-off between cracks and insufficient polarization encountered in the fabrication process. First, a typical example of the process of fabricating the piezoelectric ceramic transformer is described.

The prior art process starts with preparation of a piezoelectric ceramic plate, and electrodes are patterned on the surfaces of the piezoelectric ceramic plate.

Subsequently, the driving section and the generator section are polarized in predetermined directions. In the fabrication process for the Rosen-type piezoelectric ceramic transformer shown in FIG. 1, d.c. voltage is applied between the electrodes 2a and 2b for the driving section 1c, and d.c. voltage is applied to the electrodes 2a/2b and the end surface electrode 2c. On the other hand, when the piezoelectric ceramic plate 5 is selectively polarized, d.c. voltage is firstly applied between the comb-like electrodes 6a/7a and the stripe-shaped electrodes 10a/10b, and, thereafter, d.c. voltage is applied between the comb-like electrodes 6a/7a and the comb-like electrodes 6b/7b for the selective polarization of the driving section 5a.

Thus, the polarization is carried out under application of d.c. voltage to the electrodes. The d.c. voltage creates an electric field in the piezoelectric ceramic plate, and the electric field generates a dipole moment for the polarization. In general, the magnitude of the dipole moment is dependent on the temperature and the strength of the electric field. A strong electric field results in sufficient polarization, and a high temperature allows the manufacturer to decrease the strength of the electric field. However, a polarization under an extremely strong electric field is usually dangerous and deteriorates the piezoelectric ceramic transformer. For this reason, the piezoelectric ceramic plate with the electrodes is dipped into hot insulating oil such as silicon oil, and several kilo-volt/millimeter is applied in the hot insulating oil. The polarizing conditions are, by way of example, carried out in hot silicon oil at 100 degrees in centigrade under application of 400 volts between the electrodes spaced by 200 microns (see Japanese Patent Publication of Unexamined Application No. 64-14981), and the electric field is 2 kilo-volt/millimeter. Japanese Patent Application No. 6-17441, which discloses the piezoelectric ceramic transformer shown in FIG. 2, teaches the polarizing in hot insulating oil at 100 degrees in centigrade under the electric field of 4 kilo-volt/millimeter for the driving and generator sections 5a/5b. Another Japanese Patent Application No. 4-27040 filed by NEC Corporation discloses the polarizing conditions where d.c. voltage is applied to the electrodes of the driving section and the generator section dipped in hot insulating oil at 150 degrees in centigrade for creating the electric field of 1.5 kilo-volt/millimeter.

Thus, the polarization is carried out in hot insulating oil under application of several kilo-volt/millimeter. However, the electric field cracks the prior art piezoelectric ceramic transformer shown in FIG. 2. In detail, the distance between the stripe-shaped electrode 10a/10b and the comb-like electrode 6a/7a is much longer than the distance between the comb-like electrode 6a/7a and the other comb-like electrode 6b/7b, because the voltage step-up ratio is dependent on the ratio between these distances. The narrow distance between the comb-like electrode 6a/7a and the other comb-like electrode 6b/7b gives rise to a strong electric field, and the driving section 5a generates a large strain from a small input voltage Ein. On the other hand, the long distance between the comb-like electrode 6a/7a and the stripe-shaped electrode 10a/10b increases the amount of strain in the generator section 5b, and the large amount of strain generates a large output voltage Eout. Thus, the long distance between the stripe-shaped electrode 10a/10b and the comb-like electrode 6a/7a is desirable for a large voltage step-up ratio. However, the long distance between the stripe-shaped electrode 10a/10b and the comb-like electrode 6a/7a is undesirable for sufficient polarization, because the sufficient polarization requires an extremely large d.c. voltage. In order to suppress undesirable discharge due to a local concentration of electric force lines, the edges of the finger portions 6c to 6h are spaced from the side lines 5e/5f of the piezoelectric ceramic plate 5, and vacant area takes place between the edges and the side lines 5e/5f as indicated by broken line BL1 (see FIG. 2). As a result, although the electric field between the stripe-shaped electrodes 10a/10b and the comb-like electrodes 6a/7a causes the central portion therebetween to generate a strain, no strain is produced in the peripheral portions on both sides of the central portion encircled by broken line BL2. A stress takes place between the boundary between the central portion and each peripheral portion, and the magnitude of the stress is proportional to the strain generated in the central portion. For this reason, if the electric field between the stripe-shaped electrode 10a/10b and the comb-like electrode 6a/7a is too strong, a large stress takes place between the central portion and each peripheral portion, and the large stress cracks the piezoelectric ceramic plate 5 along the boundaries.

If the electric field between the stripe-shaped electrode 10a/10b and the comb-like electrode 6a/7a is weak, the stress is so small that the piezoelectric ceramic plate is not cracked. However, the weak electric field can not make the polarization saturated in the generator section 5b. As described hereinbefore, the strength of electric field to be required for the polarization is inversely proportional to the temperature, and an extremely high temperature allows a weak electric field to sufficiently polarize the generator section 5b. The insulating oil reaches a limit around 200 degrees in centigrade, and there remains the trade-off between the cracks and the insufficient polarization.

Figure 3:
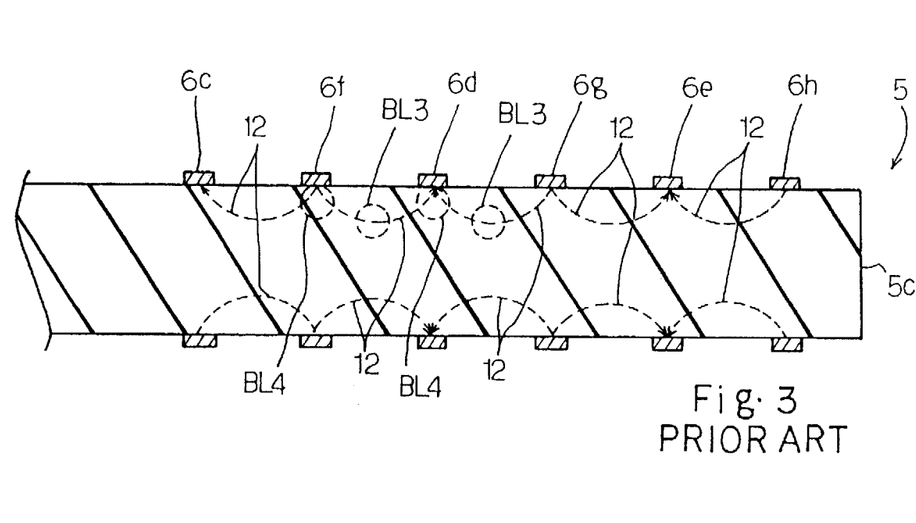
FIG. 3 is a cross sectional view showing an electric field created in a driving section of the piezoelectric ceramic transformer shown in FIG. 2.

The second problem inherent in the prior art piezoelectric ceramic transformer shown in FIG. 2 is the insufficient voltage step-up ratio. The insufficient voltage step-up ratio is derived from the vibration mode in the driving section 5a. FIG. 3 illustrates the distribution of the electric field created in the driving section 5a under the selective polarization. The electric field in the driving section 5a is represented by arcs 12, and each arc 12 starts from one of the finger portions 6f, 6g and 6h, and is terminated at the adjacent finger portion 6c/6d/6e. The dominative vibration mode is varied along the arc 12. The piezoelectric longitudinal effect is dominative in intermediate portions on the arcs 12 encircled by broken line BL3; however, the piezoelectric transverse effect is dominative in starting/terminal portions encircled in broken line BL4. In the intermediate portions, the longitudinal component of the electric force line is much larger than the component in the direction of thickness of the piezoelectric ceramic plate 5. On the other hand, the component in the direction of thickness is larger than the longitudinal component in the starting/terminal portion. Thus, the portion dominated by the piezoelectric longitudinal effect is alternated with the portion dominated by the piezoelectric transverse effect in the driving section 5a. However, the vibrations due to the piezoelectric transverse effect are anti-phase of the vibrations due to the piezoelectric longitudinal effect. When the portion dominated by the piezoelectric longitudinal effect expands in the longitudinal direction, the portion dominated by the piezoelectric transverse effect is shrunk in the longitudinal direction. Thus, the vibrations are partially canceled by the anti-phase vibrations, and the partially canceled vibrations achieve an insufficient voltage step-up ratio.

SUMMARY OF THE INVENTION

It is therefore an important object of the present invention to provide a piezoelectric ceramic transformer which achieves a large voltage step-up ratio without a disconnection between a terminal and an electrode.

It is also an important object of the present invention to provide a process of fabricating a piezoelectric ceramic transformer which sufficiently polarizes a piezoelectric ceramic plate without cracks.

In accordance with one aspect of the present invention, there is provided a piezoelectric ceramic transformer comprising: a piezoelectric ceramic plate elongated in a first direction, and divided into a first piezoelectric ceramic portion and a second piezoelectric ceramic portion in the first direction, the first piezoelectric ceramic portion being polarized in the first direction; at least one output electrode formed on an area of the first piezoelectric ceramic portion where a node of vibrations in the first direction takes place, and elongated in a second direction perpendicular to the first direction; an end surface electrode formed on an end surface of the second piezoelectric ceramic portion spaced from the at least one output electrode in the first direction; and at least one pair of input electrodes formed on the second piezoelectric ceramic portion, one of the input electrodes of the at least one pair having a plurality of first finger portions electrically connected to one another and elongated in the second direction, the other of the input electrodes having a plurality of second finger portions electrically connected to one another and elongated in the second direction, the plurality of first finger portions being electrically isolated from and interdigitated with the plurality of second finger portions so as to form gaps therebetween, the second piezoelectric ceramic portion having a plurality of first primary piezoelectric ceramic sub-portions exposed to selected gaps of the gaps and polarized in a third direction opposite to the first direction and a plurality of second primary piezoelectric ceramic sub-portions exposed to remaining gaps of the gaps, alternated with the plurality of first primary piezoelectric ceramic sub-portions and polarized in the first direction, the plurality of first primary piezoelectric ceramic sub-portions having first secondary piezoelectric ceramic sub-portions where a piezoelectric longitudinal effect is dominative and second secondary piezoelectric ceramic sub-portions where a piezoelectric transverse effect is dominative, the piezoelectric longitudinal effect being dominative in the plurality of second primary piezoelectric ceramic sub-portions without a piezoelectric ceramic sub-portion where the piezoelectric transverse effect is dominative by virtue of the end surface electrode.

In accordance with another aspect of the present invention, there is provided a process of fabricating a piezoelectric ceramic transformer, comprising the steps of: a) preparing a piezoelectric ceramic plate; b) forming at least one output electrode on a first piezoelectric ceramic portion of the piezoelectric ceramic plate and at least one pair of input electrodes on a second piezoelectric ceramic portion of the piezoelectric ceramic plate; and c) polarizing the first piezoelectric ceramic portion and the second piezoelectric ceramic portion in predetermined directions, respectively, and including the sub-steps of: c-1) applying an electric field between the at least one output electrode and the at least one pair of input electrodes at a first temperature; and c-2) decreasing the first temperature to the second temperature without changing the electric field so as to polarize the first piezoelectric ceramic portion in a longitudinal direction of the piezoelectric ceramic plate.

BRIEF DESCRIPTION OF THE DRAWINGS

The features and advantages of the piezoelectric ceramic transformer and the process of fabrication thereof according to the present invention will be more clearly understood from the following description taken in conjunction with the accompanying drawings in which.

DESCRIPTION OF THE PREFERRED EMBODIMENTS

First Embodiment

Figure 4:
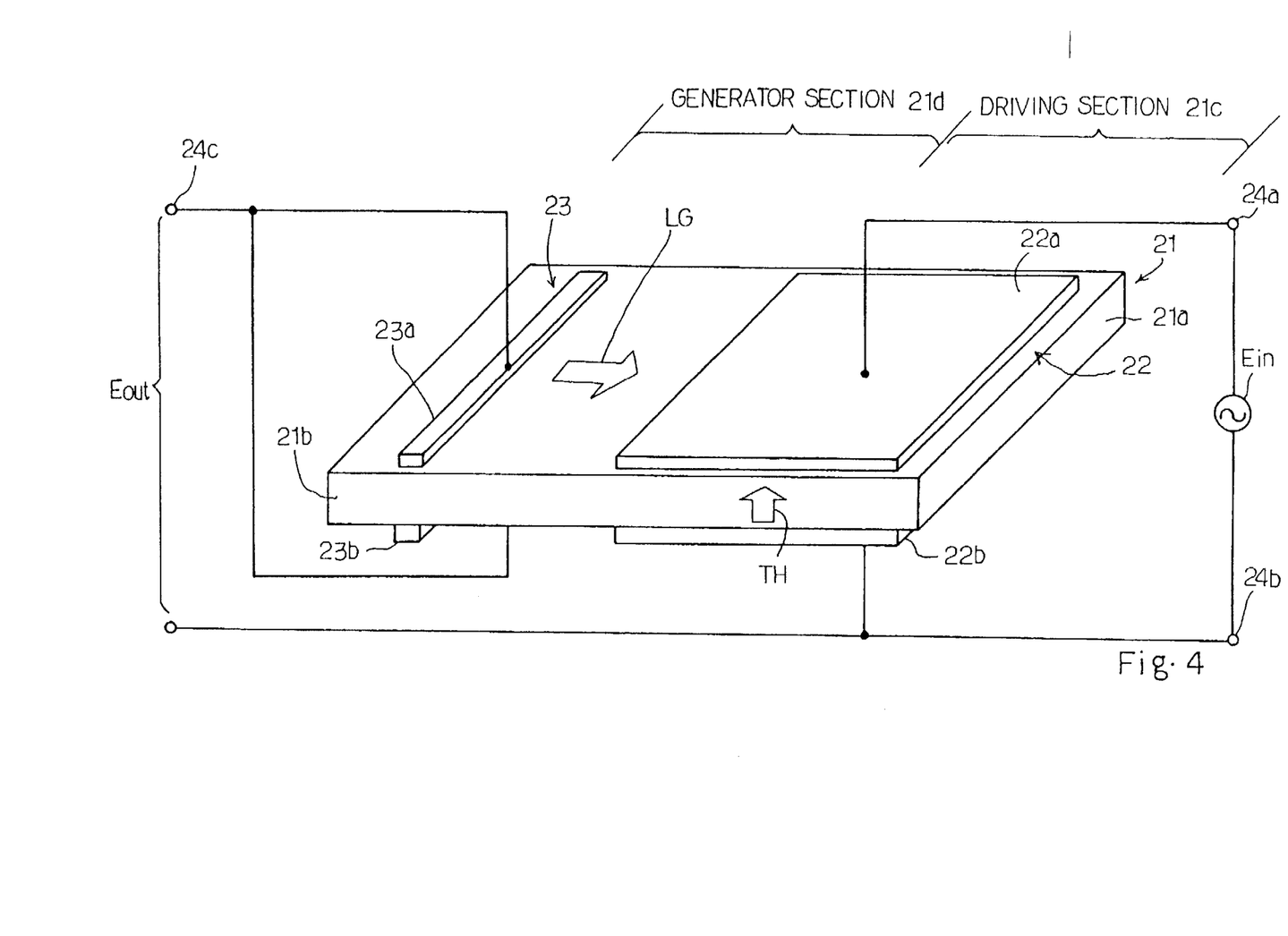
FIG. 4 is a perspective view showing the structure of a piezoelectric ceramic transformer according to the present invention.

Referring to FIG. 4 of the drawings, a piezoelectric ceramic transformer embodying the present invention largely comprises a piezoelectric ceramic plate 21, a pair of input electrodes 22 applied with an input a.c. voltage Ein and a pair of output electrodes 23. The piezoelectric ceramic transformer implementing the first embodiment is an improvement of the Rosen-type piezoelectric ceramic transformer, and the end surface electrode 2c is replaced with the pair of output electrodes 23.

The piezoelectric ceramic plate 21 is formed of piezoelectric ceramic in PZT (zircon lead titanate) system, and is divided into a right portion 21a and a left portion 21b. The right portion 21a is polarized in a longitudinal direction indicated by thick arrow LG, and the left portion 21b is polarized in a direction of thickness indicated by thick arrow TH.

The pair of input electrodes 22 has two planar electrodes 22a/22b respectively formed on the upper surface and the lower surface of the right portion 21a, and are electrically isolated from each other. The planar electrodes 22a and 22b are respectively connected to terminals 24a and 24b, and the a.c. voltage is applied between the terminals 24a and 24b.

On the other hand, the pair of output electrodes 23 has two stripe-shaped electrodes 23a/23b, and the stripe-shaped electrodes 23a/23b extends in a direction of width of the piezoelectric ceramic plate 21. The stripe-shaped electrodes 23a/23b are held in contact with the left portion 21b where nodes of longitudinal vibrations take place. For this reason, the stripe-shaped electrodes 23a and 23b are not violently shaken, and an output terminal 24c is hardly disconnected from the stripe-shaped electrodes 23a/23b. The stripe-shaped electrodes 23a/23b are connected to the output terminal 24c, and an output a.c. voltage takes place between the terminals 24b and 24c.

The right portion 21a, the pair of input electrodes 22 and the terminals 24a/24b as a whole constitute a driving section 21c, and the left portion 21b, the pair of output electrodes 23 and the terminals 24b/24c form in combination a generator section 21d.

The piezoelectric ceramic transformer according to the present invention behaves as follows. When the input s.c. voltage Ein is applied between the terminals 24a and 24b, the piezoelectric transverse effect takes place in the right portion 21a, and the right portion 21a vibrates in the longitudinal direction LG. The electromechanical coupling factor k31 is representative of the relation between the input a.c. voltage Ein and the longitudinal vibrations.

The longitudinal vibrations are propagated to the generator section 21d, and are spread over the piezoelectric ceramic plate 21. The generator section 21d converts the longitudinal vibrations to the output a.c. voltage Eout through the piezoelectric longitudinal effect. The electromechanical coupling factor k33 is representative of the relation between the longitudinal vibrations and the output a.c. voltage Eout.

Subsequently, description is made on a process of fabricating the piezoelectric ceramic transformer with reference to FIGS. 5A to 5D.

Figure 5A:
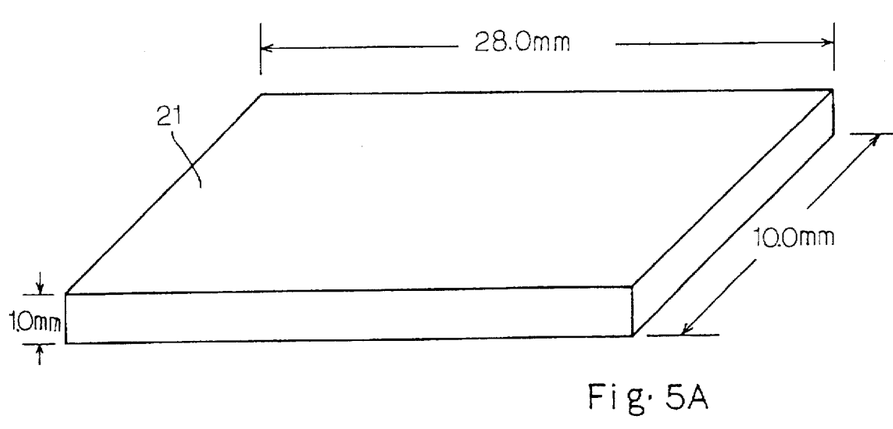
FIGS. 5A to 5D are perspective views showing a process of fabricating the piezoelectric ceramic transformer shown in FIG. 4.

The process starts with preparation of the piezoelectric ceramic plate 21. Piezoelectric ceramic material manufactured by Tokin Corporation is available for the piezoelectric ceramic plate 21. The piezoelectric ceramic material is in the PZT system, and is sold as NEPEC8. The piezoelectric ceramic plate 21 measures 28.0 millimeter in length, 10.0 millimeter in width and 1.0 millimeter in thickness. The resultant structure is illustrated in FIG. 5A.

Figure 5B:
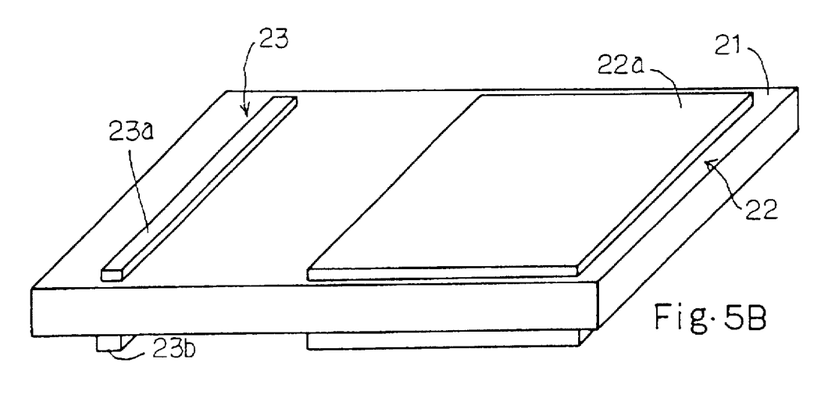

Subsequently, conductive silver paste is screen printed on the upper and lower surfaces of the piezoelectric ceramic plate 21, and the paste pattern is sintered so as to form the planar electrodes 22a/22b and the stripe-shaped electrodes 23a/23b. Conductive silver-palladium paste is also available for the electrodes 22a/22b and 23a/23b. The resultant structure is illustrated in FIG. 5B.

Figure 5C:
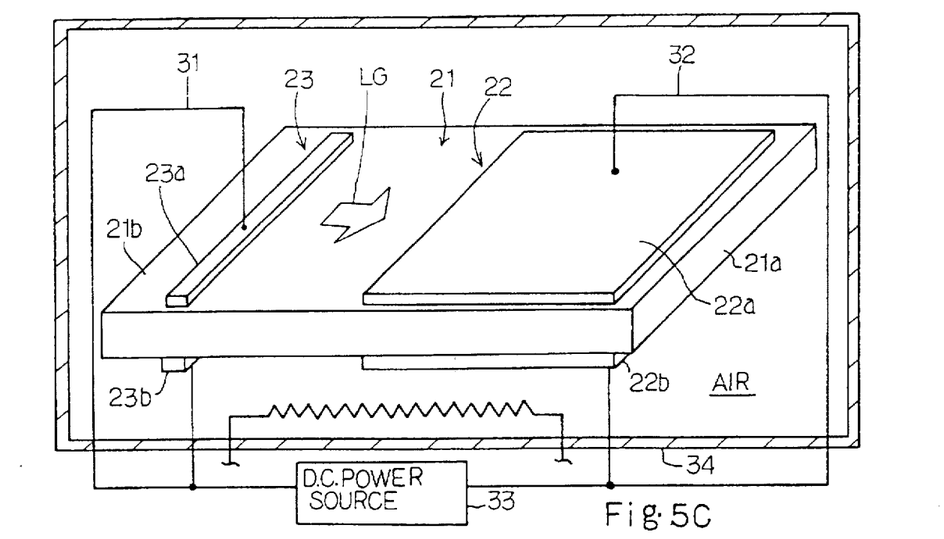

The stripe-shaped electrodes 23a and 23b are coupled by means of a conductive jig 31, and another conductive jig 32 couples the comb-like electrode 22a with the other comb-like electrode 22b. The conductive jigs 31 and 32 are connected to a d.c. power source 33. The piezoelectric ceramic plate 21 is placed in an oven 34, and the piezoelectric ceramic plate 21 is heated to 300 to 350 degrees in centigrade in the air. The d.c. power source 33 creates an electric field in the piezoelectric ceramic plate 21 between the stripe-shaped electrodes 23a/23b and the comb-like electrodes 22a/22b, and the electric field is regulated to 0.5 kilo-volt/millimeter to 0.7 kilo-volt/millimeter. The temperature in the oven 34 is decreased to 100 degrees in centigrade or less without changing the d.c. potential applied between the stripe-shaped electrodes 23a/23b and the comb-like electrodes 22a/22b. When the temperature reaches 100 degrees in centigrade, the electric field is removed from the piezoelectric ceramic plate 21. Then, the generator section 2b of the piezoelectric ceramic plate 21 is polarized in the longitudinal direction LG. This polarization is called as "electric field quenching technique". The resultant structure is illustrated in FIG. 5C.

Figure 5D:
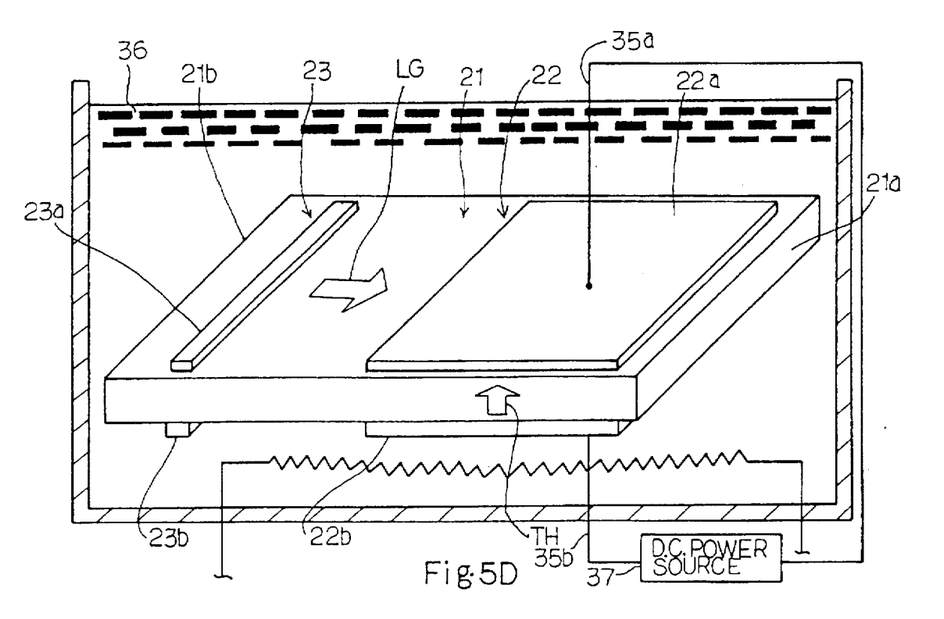

Subsequently, the driving section 21a is polarized in the direction of thickness TH. The conductive jigs 31 and 32 are removed, and metallic probes 35a and 35b are pressed against the comb-like electrodes 22a and 22b, respectively. The piezoelectric ceramic plate 21 is dipped into silicon oil 36, and the silicon oil is heated to 100 degrees to 200 degrees in centigrade. A d.c. power source 37 is connected to the metallic probes 35a/35b, and creates an electric field of 2 to 3 kilo-volt/millimeter between the comb-like electrodes 22a and 22b. As a result, the driving section 21a of the piezoelectric ceramic plate 21 is polarized in the direction of thickness TH as shown in FIG. 5D. This polarization is called a "high-temperature polarizing technique".

Thus, the generator section 21b and the driving section 21a are polarized through the electric field quenching technique and the high-temperature polarizing technique, respectively, and the piezoelectric ceramic transformer shown in FIG. 4 is obtained.

It is not recommendable to polarize the generator section in the air heated over 350 degrees in centigrade, because the conductive jigs 31 and 32 are deformed and undesirable discharge tends to be take place between the electrodes 23a/23b and 22a/22b. The polarization in the silicon oil heated over 200 degrees is also not recommendable, because the electrical insulation is liable to be broken due to the pyrolysis of oil. On the other hand, the heat-treatment lower than 300 degrees in the air and the heat-treatment lower than 100 degrees in the oil result in insufficient polarization. For this reason, the present inventors determine the temperature range between 300 degrees and 350 degrees in centigrade for the polarization in the air and the temperature range between 100 degrees and 200 degrees in centigrade for the polarization in the oil.

The present inventors evaluated the piezoelectric ceramic transformer as follows. First, a hundred samples of the piezoelectric ceramic transformer shown in FIG. 4 were fabricated through the process according to the present invention.

For the purpose of comparison, a hundred first comparative samples and a hundred second comparative samples were further fabricated as follows. The first comparative samples and the second comparative samples were similar in structure to the hundred samples of the present invention; however, the polarization was carried out in a different way. For the first comparative samples, the generator section was polarized in the air at 300 degrees in centigrade under application of electric field ranging from 0.5 kilo-volt/millimeter to 0.7 kilo-volt/millimeter, and the driving section was polarized in silicon oil at 100 degrees in centigrade under application of electric field ranging between 2 kilo-volt/millimeter and 3 kilo-volt/millimeter. For the second comparative samples, the generator section was polarized in the air at 300 degrees in centigrade under an increased electric field ranging from 0.7 kilo-volt/millimeter to 1.0 kilo-volt/millimeter, and the driving section was polarized in the silicon oil at 100 degrees in centigrade under an increased electric field between 3.0 kilo-volt/millimeter to 3.5 kilo-volt/millimeter.

Subsequently, the present inventors measured small amplitude characteristics for the samples according to the present invention, and calculated the electromechanical coupling factors k31 and k33. The electromechanical coupling factor k31 was 18.5 to 19.5 percent, and the electromechanical coupling factor k33 was 38.5 to 39.5 percent. An ideal piezoelectric ceramic transformer under the saturation in polarization had the electromechanical coupling factor k31 of 20 percent and the electromechanical coupling factor k33 of 40 percent. Thus, the samples of the piezoelectric ceramic transformer polarized in accordance with the present invention achieved the electromechanical coupling factors k31 and k33 close to those of the ideal piezoelectric ceramic transformer under the saturation in the polarization.

The present inventors further measured the small amplitude characteristics for the first comparative samples and the second comparative samples, and calculated the electromechanical coupling factors K31 and K33. As to the first comparative samples, the electromechanical coupling factor k31 was 16 percent at the maximum, and the electromechanical coupling factor k33 was 36 percent at the maximum. On the other hand, the second comparative samples achieved the maximum electromechanical coupling factors k31 and k33 equal to those of the samples according to the present invention. Thus, the samples according to the present invention were superior in the electromechanical coupling factors to the first comparative samples, and achieved a voltage step-up ratio larger than that of the first comparative example by virtue of the large electromechanical coupling factors k31 and k33.

The present inventors applied the a.c. voltage to the samples according to the present invention and the second comparative samples, and these samples were continuously driven for 240 hours. After the continuous running over 240 hours, the present inventors checked the sample according to the present invention and the second comparative samples to see whether or not a crack took place. All of the samples according to the present invention were not cracked; however, cracks took place in the second comparative samples at 10 percent, and the cracks degraded the characteristics.

Thus, the electric field quenching is effective against insufficient polarization and cracks, and the process according to the present invention fabricates the piezoelectric ceramic transformer sufficiently polarized, which achieves a large voltage step-up ratio, without a crack.

Second Embodiment

Figure 6:
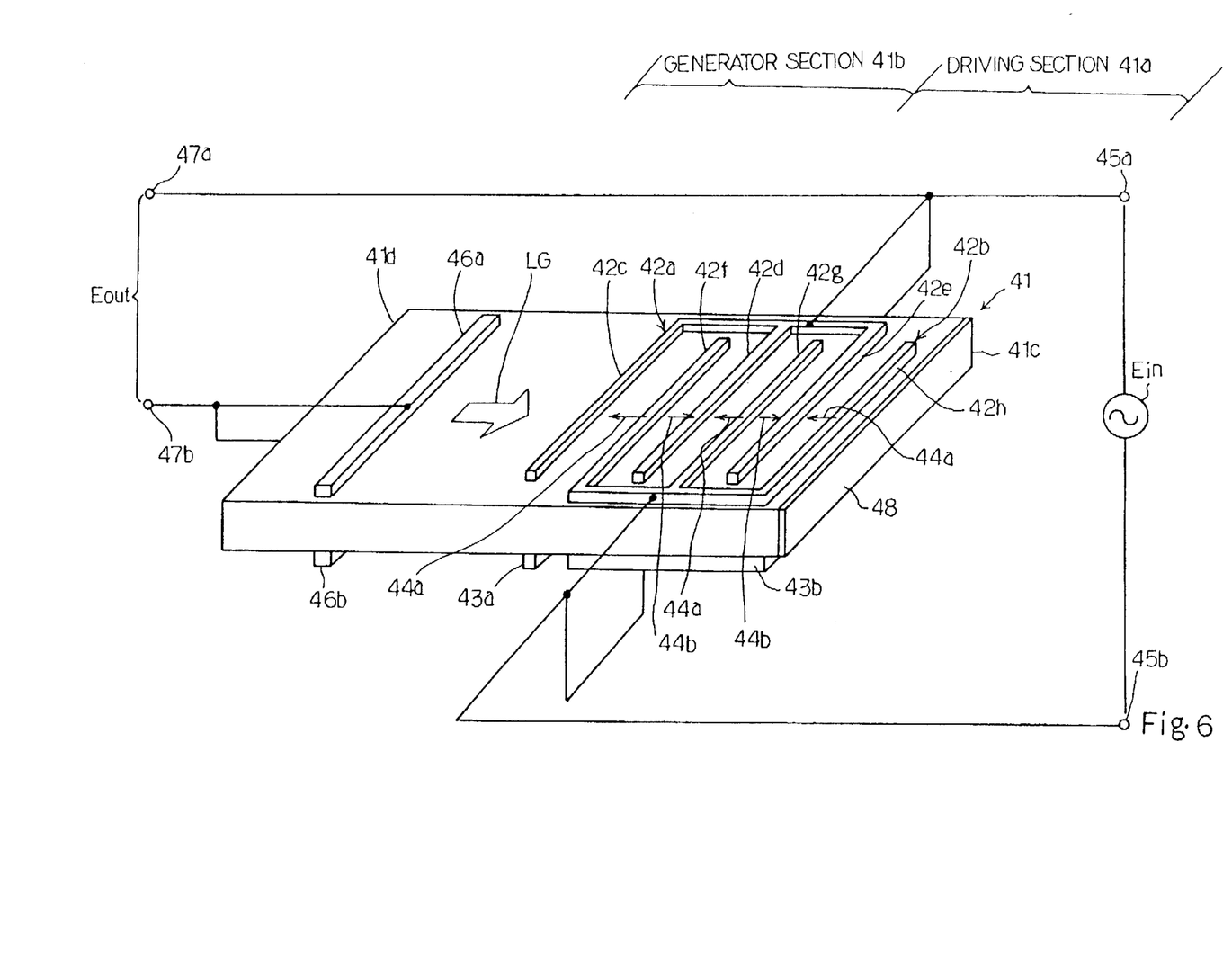
FIG. 6 is a perspective view showing the structure of another piezoelectric ceramic transformer according to the present invention.

Turning to FIG. 6 of the drawings, another piezoelectric ceramic transformer is fabricated on a piezoelectric ceramic plate 41. The piezoelectric ceramic transformer is broken down into a driving section 41a and a generator section 41b. The piezoelectric ceramic plate 41 is divided into a right portion 41c and a left portion 41d, and the right portion 41c and the left portion 41d are respectively assigned to the driving section 41a and the generator section 41b.

The driving section 41a has two pairs of comb-like electrodes 42a/42b and 43a/43b, and the two pairs of comb-like electrodes 42a/42b and 43a/43b are respectively formed on the upper surface and the lower surface of the right portion 41c. The comb-like electrodes 42a and 43a are respectively interdigitated with the comb-like electrodes 42b and 43b, and the comb-like electrodes 43a and 43b are located on the opposite side of the piezoelectric ceramic plate 41 from the comb-like electrodes 42a and 42b, respectively. The comb-like electrode 42a has finger portions 42c, 42d and 42e, and the other comb-like electrode 42b also has finger portions 42f, 42g and 42h. Gaps take place between the finger portions 42c and 42f, 42f and 42d, 42d and 42g, 42g and 42e and 42e and 42h. Though not clearly shown in FIG. 6, the comb-like electrodes 43a and 43b has finger portions, and gaps also take place therebetween.

The finger portions 42c to 42h define piezoelectric ceramic sub-portions exposed to the gaps defined therebetween, and the piezoelectric ceramic sub-portions are differently polarized. Namely, every other piezoelectric ceramic sub-portion is polarized in the opposite direction to the adjacent piezoelectric ceramic sub-portions. In this instance, the piezoelectric ceramic sub-portions between the finger portions 42c and 42f, 42d and 42g and 42e and 42h are polarized in a direction indicated by arrows 44a, and the piezoelectric ceramic sub-portions between the finger portions 42f and 42d and 42g and 42e are polarized in a direction indicated by arrows 44b.

A pair of input terminals 45a/45b are provided for the two pairs of comb-like electrodes 42a/42b and 43a/43b. The input terminal 45a is connected to the comb-like electrodes 42a and 43a, and the other input terminal 45b is connected to the comb-like electrodes 42b and 43b.

The generator section 4b has stripe-shaped electrodes 46a and 46b formed on the upper and lower surfaces of the left portion 41d, respectively. The stripe-shaped electrodes 46a and 46b are elongated in a direction of width of the piezoelectric ceramic plate 41. The stripe-shaped electrode 46b is formed on the opposite side of the piezoelectric ceramic plate 41 from the stripe-shaped electrode 46a, and the left portion 41d is polarized in the longitudinal direction LG of the piezoelectric ceramic plate 41.

A pair of output terminals 47a and 47b is provided for the generator section 41b. The stripe-shaped electrodes 46a and 46b are connected to the output terminal 47b, and the other output terminal 47a is connected to the comb-like electrodes 42a/43a.

The piezoelectric ceramic transformer further comprises an end surface electrode 48. The end surface electrode 48 is used in a polarization of the driving section 41a, but is not used in the voltage step-up.

The stripe-shaped electrodes 46a and 46b are positioned at areas where nodes of the longitudinal vibrations take place, and, for this reason, the output terminal 47b is hardly disconnected.

When an a.c. voltage Ein is applied to the input terminals 45a and 45b, the piezoelectric longitudinal effect takes place in the driving section 41a, and the driving section 41a vibrates in the longitudinal direction LG. The conversion between the a.c. voltage Ein and the longitudinal vibrations is expressed by the electromechanical coupling factor k33. The longitudinal vibrations are propagated to the generator section 41b, and give rise to the longitudinal vibrations over the entire piezoelectric ceramic plate 41. The generator section 41b converts the longitudinal vibrations to an output potential Eout between the output terminals 47a and 47b through the piezoelectric longitudinal effect. The conversion between the longitudinal vibrations and the output potential Eout is also represented by the electromechanical coupling factor k33.

Description is hereinbelow made on a process of fabricating the piezoelectric ceramic transformer with reference to FIGS. 7A to 7D.

Figure 7A:
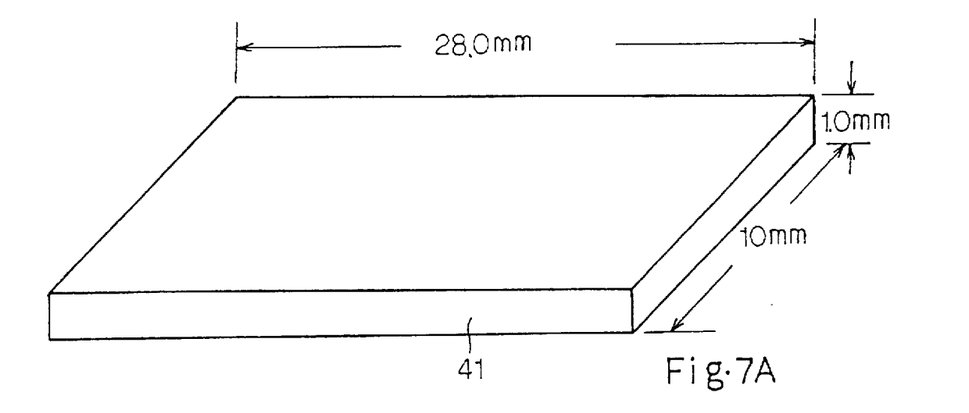
FIGS. 7A to 7D are perspective views showing a process of fabricating the piezoelectric ceramic transformer shown in FIG. 6.

The process starts with preparation of the piezoelectric ceramic plate 41. Piezoelectric ceramic material NEPEC8 is also used for the piezoelectric ceramic plate 21. The piezoelectric ceramic plate 41 measures 28.0 millimeter in length, 10.0 millimeter in width and 1.0 millimeter in thickness. The resultant structure is illustrated in FIG. 7A.

Figure 7B:
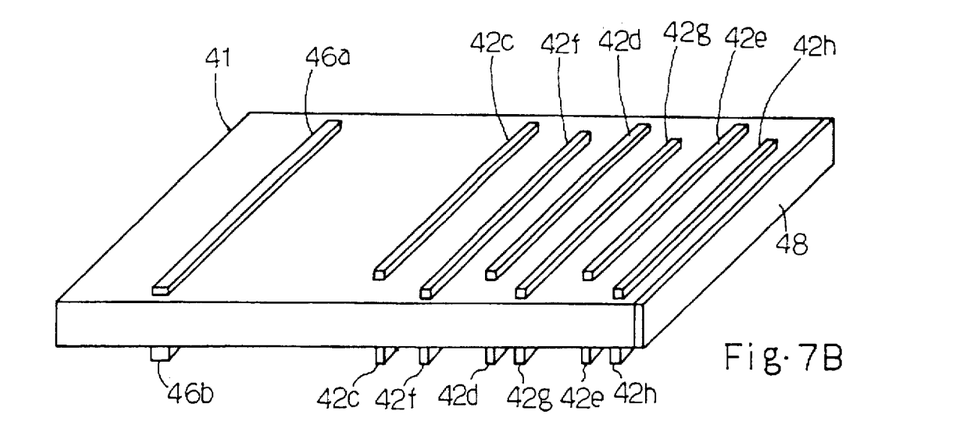

Subsequently, conductive silver paste is screen printed on the upper and lower surfaces of the piezoelectric ceramic plate 41 for the finger portions 42c to 42h and the stripe-shaped electrodes 46a/46b, and a conductive paste is coated on the end surface for the end surface electrode 48. The paste pattern is sintered so as to form the finger portions 42c to 42h, the stripe-shaped electrodes 46a/46b and the end surface electrode 48. The finger portions forming parts of the comb-like electrodes 43a/43b are labeled with the same references as those of the comb-like electrodes 42a/42b. Conductive silver-palladium paste is also available for these electrodes. The resultant structure is illustrated in FIG. 7B.

Figure 7C:
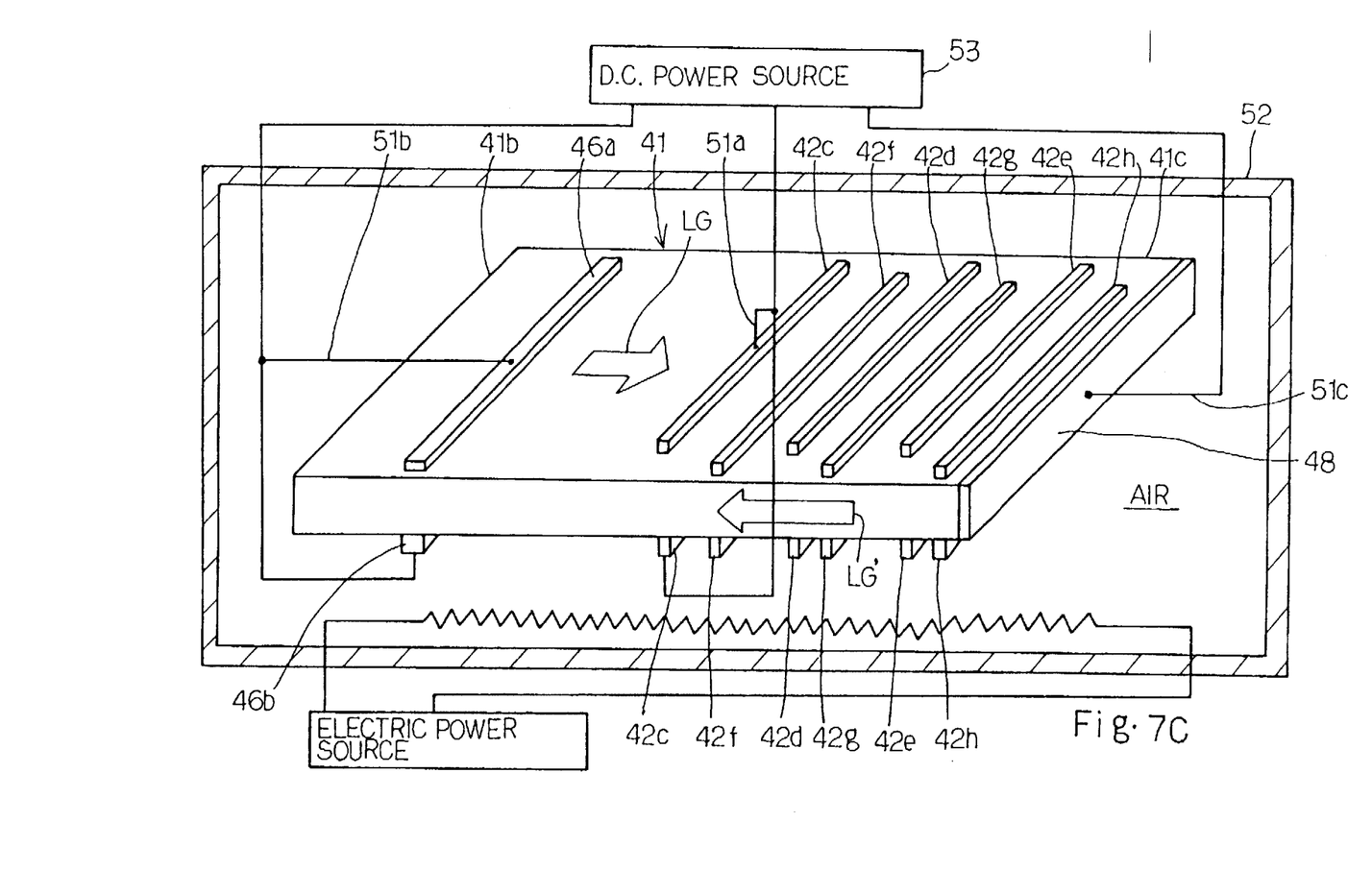

The finger portions 42c are clamped with a conductive jig 51a, and another conductive jig 5b clamps the stripe-shaped electrodes 46a and 46b. A conductive probe 51c is pressed against the end surface electrode 48, and the piezoelectric ceramic plate 41 is placed in an oven 52. The piezoelectric ceramic plate 41 is heated to 300 degrees to 350 degrees in centigrade in the air inside of the oven 52, and a d.c. power source 53 supplies d.c. voltage between the stripe-shaped electrodes 46a/46b, the finger portions 42c and the end surface electrode 48 in such a manner that the d.c. voltage creates an electric field of 0.5 to 0.7 kilo-volt/millimeter between the stripe-shaped electrodes 46a/46b and the finger portions 42c and an electric field of 0.5 to 0.7 kilo-volt/millimeter between the finger portions 42c and the end surface electrode 48. Thereafter, the temperature in the oven 52 is decreased to 100 degrees in centigrade or less without changing the d.c. potential applied between the stripe-shaped electrodes 46a/46b, the finger portions 42c and the end surface electrode 48. When the temperature reaches 100 degrees in centigrade, the electric field is removed from the piezoelectric ceramic plate 41. Then, the generator section 4b and the driving section 41a are polarized in the longitudinal direction indicated by thick arrow LG and the opposite direction indicated by thick arrow LG', respectively. The direction LG' is opposite to the longitudinal direction LG. The resultant structure is illustrated in FIG. 7C.

Figure 7D:
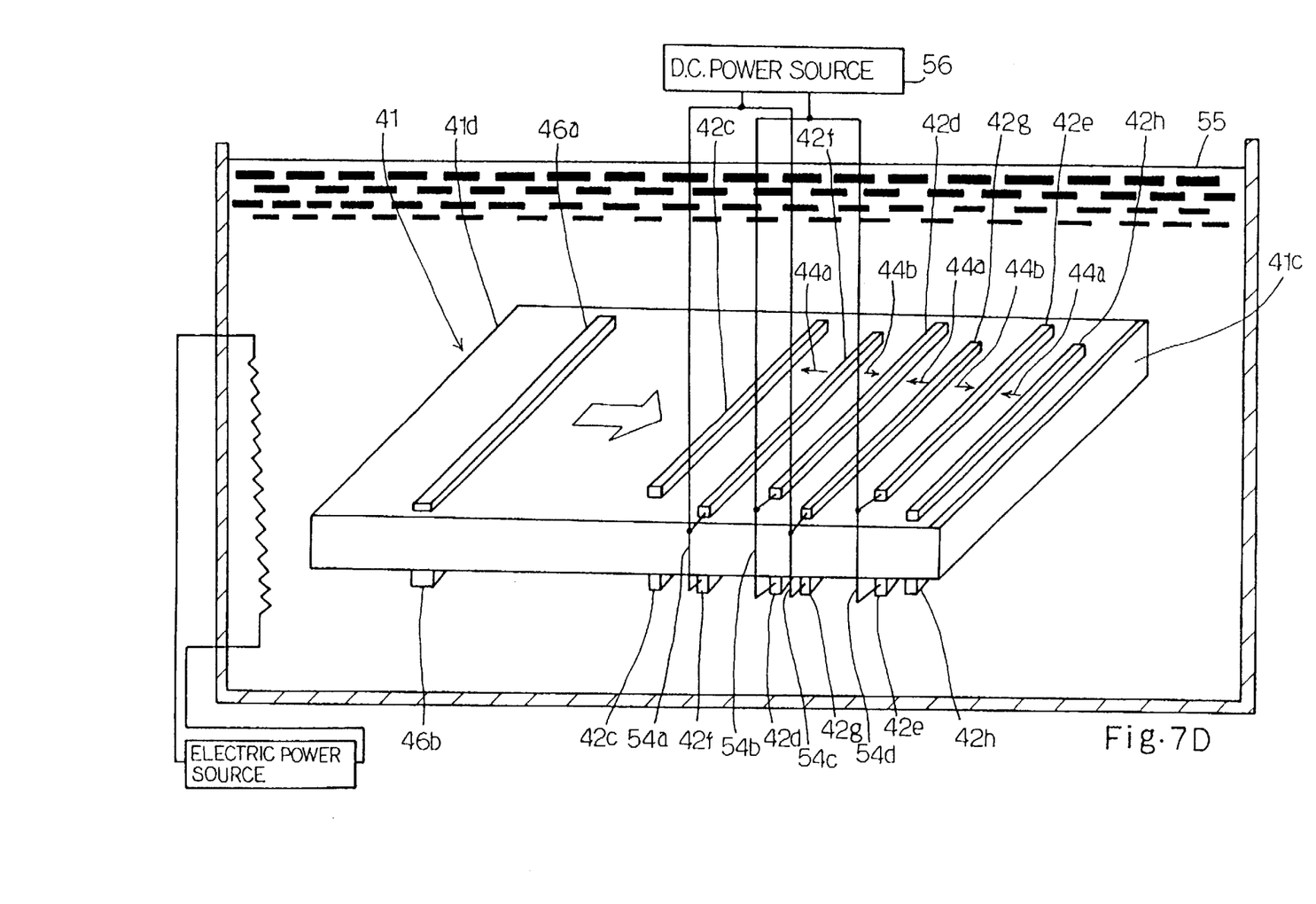

Subsequently, every other piezoelectric ceramic sub-portion is inverted in polarity. In detail, the conductive jigs 51a/5b and the probe 51c are detached, and conductive jigs 54a, 54b, 54c and 54d clamp the pairs of finger portions 42f, 42d, 42g and 42e, respectively.

The piezoelectric ceramic plate 41 is dipped into silicon oil 55, and the silicon oil 55 is heated to 100 degrees to 200 degrees in centigrade. A d.c. power source 56 is connected between the jigs 54a/54c and 54b/54d, and creates electric fields of 2 to 3 kilo-volt/millimeter between finger portions 42f and 42d and between the finger portions 42d and 42g. As a result, the polarity is inverted in the piezoelectric ceramic sub-portions between the finger portions 42f and 42d and between the finger portions 42g and 42e as indicated by arrows 44b. The resultant structure is shown in FIG. 7D.

Finally, the finger portions 42c to 42e are connected to one another for forming the comb-like electrodes 42a/43a, and the finger portions 42f to 42h are connected to one another for forming the other comb-like electrodes 42b/43b.

Figure 8:
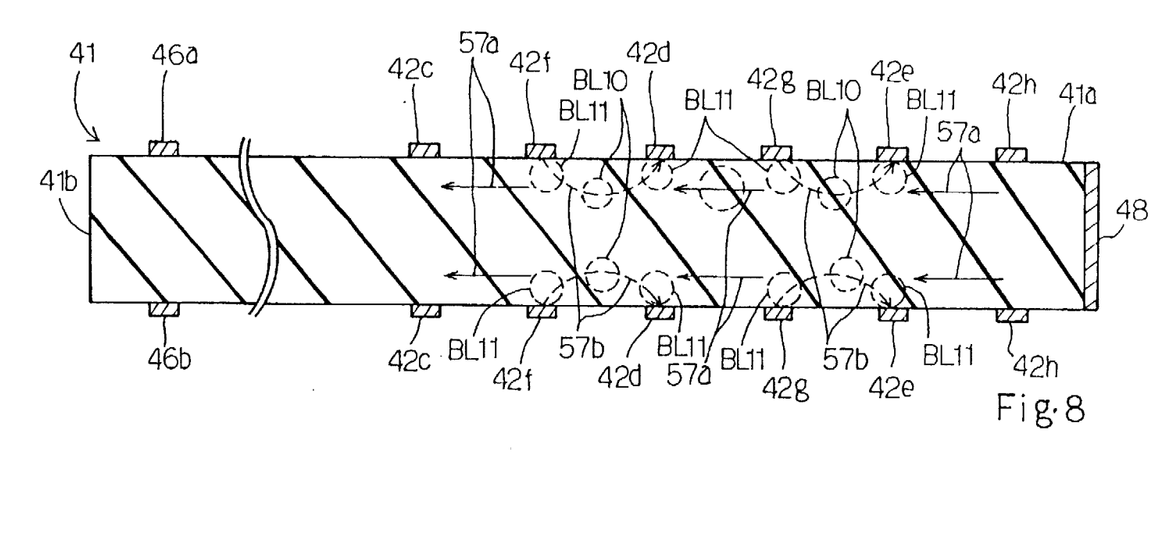
FIG. 8 is a cross sectional view showing an electric field created in a driving section of the piezoelectric ceramic transformer.

Thus, the driving section 41a is selectively polarized in the different directions 44a and 44b, and FIG. 8 illustrates a distribution of electric field created in the driving section 41a. Arrows 57a is representative of the electric fields in the piezoelectric ceramic sub-portions between the finger portions 42c and 42f, the finger portions 42d and 42g and the finger portions 42e and 42h, and are in parallel to the longitudinal direction. This means that the electric fields do not have a component in the direction of thickness. In other words, only the piezoelectric longitudinal effect takes place in the piezoelectric sub-portions between the finger portions 42c and 42f, the finger portions 42d and 42g and finger portions 42e and 42h.

On the other hand, the electric fields in the piezoelectric ceramic sub-portions between the finger portions 42f and 42d and between the finger portions 42g and 42e are represented by arcs 57b. The component in the direction of thickness is negligible in an intermediate portion encircled by broken lines BL10, and the piezoelectric longitudinal effect is dominative in these intermediate portions. However, both end portions encircled by broken lines BL11 contain a substantial amount of component in the direction of thickness, and the piezoelectric transverse effect is dominative in the end portions.

Comparing the distribution of the electric field shown in FIG. 8 with the distribution of the electric field shown in FIG. 3, it is under stood that the driving section 41a is smaller in the total amount of the component in the direction of thickness than the driving section 5a, because the piezoelectric ceramic sub-portions between the finger portions 42c and 42f, the finger portions 42d and 42g and the finger portions 42e and 42h do not have any component in the direction of thickness. As described hereinbefore, the longitudinal vibrations due to the piezoelectric transverse effect are anti-phase of the longitudinal vibrations due to the piezoelectric longitudinal effect. The influence of the piezoelectric transverse effect on the driving section 41a is less than the influence of the piezoelectric transverse effect on the driving section 5a, and, for this reason, the driving section 41a generates the longitudinal vibrations wider in amplitude than the longitudinal vibrations in the driving section 5a. The wider amplification results in a large voltage step-up ratio, and the piezoelectric ceramic transformer implementing the second embodiment is surely improved in the voltage step-up ratio.

The present inventors evaluated the piezoelectric ceramic transformer as follows. First, a hundred samples of the piezoelectric ceramic transformer shown in FIG. 6 were fabricated through the process according to the present invention.

For the purpose of comparison, a hundred third comparative samples and hundred fourth comparative samples were further fabricated as follows. The first comparative samples and the second comparative samples were similar in structure to the hundred samples of the present invention; however, the polarization was carried out in a different way. For the first comparative samples, the generator and driving sections were firstly polarized in the air at 300 degrees in centigrade under application of electric field ranging from 0.5 kilo-volt/millimeter to 0.7 kilo-volt/millimeter, and the polarity of the driving section was selectively inverted in silicon oil at 100 degrees in centigrade under application of electric field ranging between 2 kilo-volt/millimeter and 3 kilo-volt/millimeter. For the second comparative samples, the generator and driving sections were firstly polarized in the air at 300 degrees in centigrade under an increased electric field ranging from 0.7 kilo-volt/millimeter to 1.0 kilo-volt/millimeter, and the polarity of the driving section was selectively inverted in the silicon oil at 100 degrees in centigrade under an increased electric field between 3.0 kilo-volt/millimeter to 3.5 kilo-volt/millimeter.

Subsequently, the present inventors measured small amplitude characteristics for the samples according to the present invention, and calculated the electromechanical coupling factor k33. The electromechanical coupling factor k33 was 38.5 to 39.5 percent in the generator sections and 35.5 to 35.6 percent in the driving sections. The generator sections were roughly equal to the electromechanical coupling factor k33 of an ideal piezoelectric ceramic transformer under the saturated polarization of 40 percent. The reason why the electromechanical coupling factor was roughly equal to k33 in the driving sections was the narrow distance between the comb-like electrodes 42a/43a and 42b/43b.

The present inventors further measured the small amplitude characteristics for the third comparative samples and the fourth comparative samples, and calculated the electromechanical coupling factor K33. As to the third comparative samples, the electromechanical coupling factor k33 was 36 percent in the generator sections at the maximum and 33 percent in the driving section at the maximum. On the other hand, the fourth comparative samples achieved the maximum electromechanical coupling factor k31 equal to that of the samples according to the present invention. Thus, the samples according to the present invention were superior in the electromechanical coupling factor K33 to the third comparative samples, and improved the voltage step-up ratio by virtue of the large electromechanical coupling factor k33.

The present inventors applied the a.c. voltage to the samples according to the present invention and the fourth comparative samples, and these samples were continuously driven for 240 hours. After the continuous running over 240 hours, the present inventors checked the sample according to the present invention and the fourth comparative samples to see whether or not a crack took place. All of the samples according to the present invention were not cracked; however, cracks took place in the fourth comparative samples at 20 percent, and the cracks degraded the characteristics.

Thus, the electric field quenching is effective against insufficient polarization and cracks, and the process according to the present invention fabricates the piezoelectric ceramic transformer sufficiently polarized, which achieves a large voltage step-up ratio, without a crack.

Although particular embodiments of the present invention have been shown and described, it will be obvious to those skilled in the art that various changes and modifications may be made without departing from the spirit and scope of the present invention.

The piezoelectric ceramic transformer shown in FIG. 4 has the stripe-shaped electrodes 23a/23b respectively formed on the upper surface and the lower surface of the generator section 21b. However, even if one of the stripe-shaped electrodes 23a/23b is formed on either surface, the stripe shaped electrode can achieve the advantages of the first embodiment.

Moreover, the polarization according to the present invention is available for the Rosen-type piezoelectric ceramic transformer shown in FIG. 1.

Although the piezoelectric ceramic transformer shown in FIG. 6 has two sets of electrodes 42a/42b/46a and 43a/43b/46b formed on the upper surface and the lower surface of the piezoelectric ceramic plate 41, respectively, one of the two sets of electrodes allows the piezoelectric ceramic transformer to step up the input potential Ein to the output potential Eout.

What is claimed is:

1. A process of fabricating a piezoelectric ceramic transformer, comprising the steps of:

a) preparing a piezoelectric ceramic plate;

b) forming at least one output electrode on a first piezoelectric ceramic portion of said piezoelectric ceramic plate and at least one pair of input electrodes on a second piezoelectric ceramic portion of said piezoelectric ceramic plate; and c) polarizing said first piezoelectric ceramic portion and said second piezoelectric ceramic portion in predetermined directions, respectively, and including the sub-steps of:

c-1) applying an electric field between said at least one output electrode and said at least one pair of input electrodes at a first temperature; and c-2) decreasing said first temperature to a second temperature without changing said electric field so as to polarize said first piezoelectric ceramic portion in a longitudinal direction of said piezoelectric ceramic plate.

2. The process as set forth in claim 1, in which said electric field ranges from 0.5 kilo-volt/millimeter to 0.7 kilo-volt/millimeter, and said first piezoelectric ceramic portion is heated in the air to said first temperature ranging from 300 degrees to 350 degrees in centigrade.

3. The process as set forth in claim 1, in which said first piezoelectric ceramic portion is polarized under said electric field ranging from 0.5 kilo-volt/millimeter to 0.7 kilo-volt/ millimeter in the air at said first temperature between 300 degrees to 350 degrees in centigrade in said step c-1), and said first temperature is decreased to said second temperature equal to or less than 100 degrees in centigrade in said step c-2).

4. The process as set forth in claim 1, in which said step c) further includes
   c-3) creating another electric field in said second piezoelectric ceramic portion in an insulating oil at a third temperature lower than said first temperature.

5. A process of fabricating a piezoelectric ceramic transformer, comprising the steps of:
   a) preparing a piezoelectric ceramic plate;
   b forming at least one output electrode on a first piezoelectric ceramic portion of said piezoelectric ceramic plate and at least one pair of input electrodes on a second piezoelectric ceramic portion of said piezoelectric ceramic plate; and
   c) polarizing said first piezoelectric ceramic portion and said second piezoelectric ceramic portion in predetermined directions, respectively, and including the sub-steps of:
      c-1) applying an electric field between said at least one output electrode and said at least one pair of input electrodes at a first temperature;
      c-2) decreasing said first temperature to a second temperature without changing said electric field so as to polarize said first piezoelectric ceramic portion in a longitudinal direction of said piezoelectric ceramic plate;
      c-3) creating another electric field in said second piezoelectric ceramic portion in silicon oil at a third temperature lower than said first temperature and ranging from 100 degrees 200 degrees centigrade.

6. A process of fabricating a piezoelectric ceramic transformer, comprising the steps of:
   a) preparing a piezoelectric ceramic plate having an upper surface and a lower surface;
   b) forming at least one output electrode on a first piezoelectric ceramic portion of said piezoelectric ceramic plate and at least one pair of input electrodes on said upper and lower surfaces, where said upper and lower surfaces are within a second piezoelectric ceramic portion of said piezoelectric ceramic plate; and
   c) polarizing said first piezoelectric ceramic portion and said second piezoelectric ceramic portion in predetermined directions, respectively, and including the sub-steps of:
      c-1) applying an electric field between said at least one output electrode and said at least one pair of input electrodes at a first temperature;
      c-2) decreasing said first temperature to a second temperature without changing said electric field so as to polarize said first piezoelectric ceramic portion in a longitudinal direction of said piezoelectric ceramic plate;
      c-3) creating another electric field in said second piezoelectric ceramic portion between said input electrodes in a silicon oil at a third temperature lower than said second temperature and ranging from 100 degrees to 200 degrees centigrade so as to polarize said second piezoelectric ceramic portion in a direction of the thickness of said piezoelectric plate.

7. A process of fabricating a piezoelectric ceramic transformer, comprising the steps of:
   a) preparing a piezoelectric ceramic plate having an end surface;
   b) forming at least one output electrode on a first piezoelectric ceramic portion of said piezoelectric ceramic plate and at least one pair of input electrodes on a second piezoelectric ceramic portion of said piezoelectric ceramic plate, said at least one pair of electrodes having a first comb-like input formed on a first surface of said piezoelectric ceramic plate where said first surface is vertical to said end surface, and having a plurality of first finger portions and a second comb-like input electrode formed on said first surface portion and having a plurality of second finger portions respectively interdigitated without an electrical connection between said plurality of first finger portions and said plurality of second finger portions,
   said plurality of first finger portions and said plurality of second finger portions defining a plurality of piezoelectric sub-portions in said second piezoelectric ceramic portion respectively exposed to gaps between said plurality of first finger portions and said plurality of second finger portions; and
   c) polarizing said first piezoelectric ceramic portion and said second piezoelectric ceramic portion in predetermined directions, respectively, and including the sub-steps of:
      c-1) applying an electric field between said at least one output electrode and said at least one pair of input electrodes at a first temperature;
      c-2) decreasing said first temperature to a second temperature without changing said electric field so as to polarize said first piezoelectric ceramic portion in a longitudinal direction of said piezoelectric ceramic plate;
      c-3) creating another electric field in said second piezoelectric ceramic portion in an insulating oil at a third temperature lower than said first temperature,
   wherein said electric field is created between said at least one output electrode, a first finger portion of said plurality of first finger portions closest to said at least one output electrode and said end surface electrode so as to concurrently polarize said first piezoelectric ceramic portion in the opposite direction to said longitudinal direction in said sub-steps of c-1) and c-2), and
   wherein a direct-current voltage is selectively applied between first finger portions selected from said plurality of first finger portions and second finger portions selected from said plurality of second finger portions so as to invert a polarity of every other piezoelectric ceramic sub-portion of said second piezoelectric ceramic portion in said sub-step c-3.

* * * * *